US011107793B2

(12) United States Patent
Yun et al.

(10) Patent No.: US 11,107,793 B2
(45) Date of Patent: Aug. 31, 2021

(54) STRETCHABLE DISPLAY DEVICE

(71) Applicant: LG Display Co., Ltd., Seoul (KR)

(72) Inventors: Jung-Hoon Yun, Seongnam-si (KR); Youn-Yeol Yu, Gimpo-si (KR); Yeong-Min Yoon, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 16/700,486

(22) Filed: Dec. 2, 2019

(65) Prior Publication Data
US 2020/0203312 A1    Jun. 25, 2020

(30) Foreign Application Priority Data
Dec. 19, 2018   (KR) .......................... 10-2018-0164848

(51) Int. Cl.
*H01L 25/065*   (2006.01)
*H01L 27/32*    (2006.01)
*H01L 51/00*    (2006.01)

(52) U.S. Cl.
CPC ...... *H01L 25/0655* (2013.01); *H01L 27/3293* (2013.01); *H01L 51/0097* (2013.01)

(58) Field of Classification Search
CPC ............. H01L 25/0655; H01L 27/3293; H01L 51/0097; H01L 25/16; H01L 27/3276; Y02E 10/549; G09G 3/3208
See application file for complete search history.

(56) References Cited

U.S. PATENT DOCUMENTS

| | | | |
|---|---|---|---|
| 2016/0103537 A1* | 4/2016 | Park | G06F 3/04164 345/174 |
| 2016/0111481 A1* | 4/2016 | Jeong | H01L 51/0097 257/40 |
| 2016/0221294 A1* | 8/2016 | Choi | B32B 27/40 |
| 2016/0240802 A1* | 8/2016 | Lee | H01L 27/3241 |
| 2016/0268352 A1* | 9/2016 | Hong | H01L 51/0097 |
| 2017/0053976 A1* | 2/2017 | Oh | H01L 27/326 |
| 2017/0156662 A1* | 6/2017 | Goodall | G16H 50/30 |
| 2017/0181277 A1* | 6/2017 | Tomita | H05K 1/0283 |
| 2017/0263880 A1* | 9/2017 | Lee | H01L 27/3244 |
| 2018/0046221 A1* | 2/2018 | Choi | G02B 26/0825 |
| 2018/0114825 A1* | 4/2018 | Hong | H01L 27/326 |
| 2018/0182838 A1* | 6/2018 | Yeo | H01L 27/3279 |
| 2019/0033628 A1* | 1/2019 | Kawata | G02F 1/0107 |
| 2019/0198782 A1* | 6/2019 | Kim | H01L 51/5253 |
| 2020/0020273 A1* | 1/2020 | Hong | G09G 3/32 |
| 2020/0343463 A1* | 10/2020 | Lee | H01L 51/0097 |
| 2021/0028155 A1* | 1/2021 | Kim | H01L 27/3276 |

(Continued)

*Primary Examiner* — Bitew A Dinke
(74) *Attorney, Agent, or Firm* — Birch, Stewart, Kolasch & Birch, LLP

(57) ABSTRACT

A stretchable display device capable of being stretched or contracted by external force is discussed. The stretchable display device includes a stretchable substrate capable of being stretched or contracted and divided into a display area and a non-display area, a plurality of organic light emitting diode (OLED) panels disposed in the display area of the stretchable substrate at a constant interval, a plurality of data link lines, a first constant voltage link line and a second constant voltage link line disposed in the non-display area of the stretchable substrate and connected to each of the OLED panels, and a plurality of stretchable lines disposed inside the stretchable substrate in a predetermined shape.

10 Claims, 7 Drawing Sheets

(56) References Cited

U.S. PATENT DOCUMENTS

2021/0056873 A1\* 2/2021 Jung .................. G09F 9/301
2021/0066266 A1\* 3/2021 Jung .................. H01L 25/165
2021/0098555 A1\* 4/2021 Kim .................. H01L 27/3276

\* cited by examiner

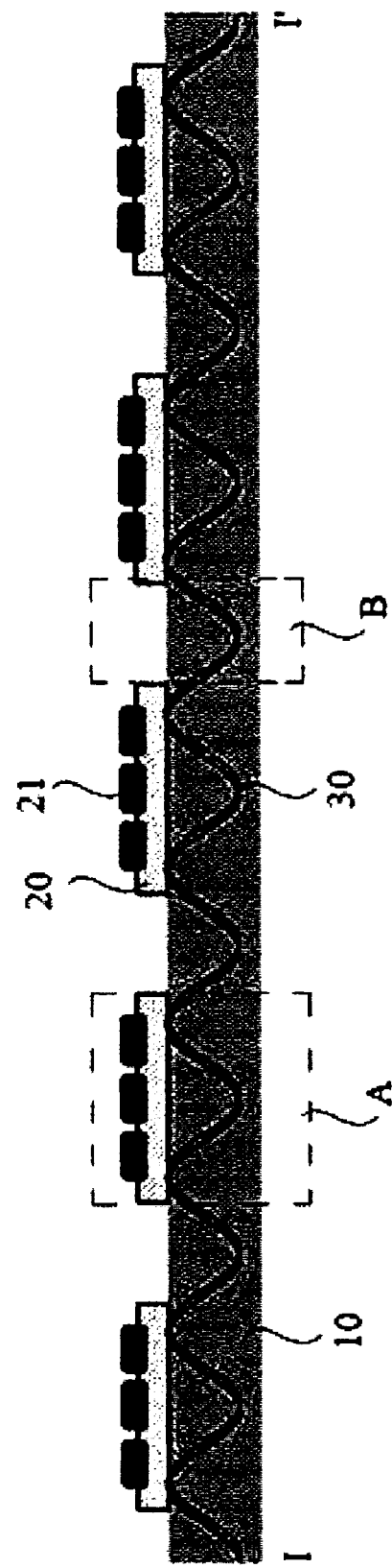

STRETCHABLE DISPLAY DEVICE

This application claims the priority benefit of Korean Patent Application No. 10-2018-0164848, filed in the Republic of Korea on Dec. 19, 2018, which is hereby incorporated by reference as if fully set forth herein.

BACKGROUND OF THE INVENTION

Field of the Invention

The present invention relates to a stretchable display device and, more particularly, to a stretchable display device capable of being stretched or contracted by external force.

Discussion of the Related Art

The field of displays for processing and displaying a large amount of information has rapidly developed and various display devices are being developed.

As examples of the display device, a liquid crystal display (LCD) device, a plasma display panel (PDP) device, a field emission display (FED) device, an electroluminescent display (ELD) device, an organic light emitting diode (OLED) display device, etc. have been developed. Such display devices have been evolved to realize thinness, lightweight, low power consumption, etc.

However, since the above-described display devices use glass substrates in order to withstand high heat generated during a manufacturing process, there is a limitation in realizing thinness, lightweight and flexibility.

Accordingly, in recent years, a flexible display device capable of maintaining display performance even when being bent like paper, by using a flexible material, which is capable of being folded or unfolded, such as a plastic film, instead of a glass substrate, is emerging as the next-generation flat display device. Such a flexible display device is thin, light, resistant to impact, and bendable, foldable or rollable, thereby being easily carried. In addition, the flexible display device may be manufactured in various shapes and usability thereof may be expanded in the future.

Such flexible display device technology has undergone experimental stages and mass production of flexible display devices is coming up. A flexible display device will provide a new input/output interface different from that of electronic apparatuses having a conventional rigid display device, thereby providing new user experience.

In recent years, research into stretchable display devices capable of being stretched or contracted by external force is ongoing.

In order to realize such a stretchable display device, it is necessary to ensure stretchability of a substrate, various insulating layers formed on the substrate and signal lines formed of a metal material. However, in technology related to the display devices developed up to now, it is difficult to ensure stretchability of the substrate, the signal lines and the insulating films.

SUMMARY OF THE INVENTION

Accordingly, the present invention is directed to a stretchable display device that substantially obviates one or more problems due to limitations and disadvantages of the related art.

An object of the present invention is to provide a stretchable display device capable of ensuring stretchability of lines such as signal lines.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a stretchable display device includes a stretchable substrate capable of being stretched or contracted and divided into a display area and a non-display area, a plurality of organic light emitting diode (OLED) panels disposed in the display area of the stretchable substrate at a constant interval, a plurality of data link lines, a first constant voltage link line and a second constant voltage link line disposed in the non-display area of the stretchable substrate and connected to each of the OLED panels, and a plurality of stretchable lines disposed inside the stretchable substrate in a predetermined shape.

The stretchable display device can further include a non-stretchable substrate at one or more sides of the stretchable substrate, and a gate driver and a data driver can be disposed on the non-stretchable substrate.

The stretchable substrate can be formed of one of thermosetting polyurethane, thermoplastic polyurethane, silicone, polyvinyl chloride, natural rubber, polydimethylsiloxane (PDMS) and ethylene propylene rubber.

The plurality of data link lines and the first and second constant voltage link lines can be formed on different layers.

The plurality of data link lines and the first and second constant voltage link lines can be formed in a stretchable or contractible pattern.

Each of the OLED panels can have a bar shape extending in a Y-axis direction, include a unit pixel including at least three subpixels in a horizontal direction, and include a plurality of unit pixels in the Y-axis direction.

A gate signal can be applied to each of the stretchable lines and each of the stretchable lines can be connected to a gate line of each of the OLED panels.

Each of the stretchable lines can include a support and a conductor line wound around the support at a constant interval.

The support can be formed of the same material as the stretchable substrate and have a circular cross-sectional shape.

The conductor line can be formed of one of copper, gold, silver, aluminum, titanium, molybdenum, tungsten, nickel, iron and an alloy thereof.

According to another aspect of the present invention, a stretchable display device includes a stretchable substrate capable of being stretched or contracted and divided into a display area and a non-display area, a plurality of first organic light emitting diode (OLED) panels disposed in the display area of an upper area of the stretchable substrate at a constant interval, a plurality of second OLED panels disposed in the display area of a lower surface of the stretchable substrate at a constant interval, a plurality of first data link lines, a first constant voltage link line and a second constant voltage link line disposed in the non-display area of the upper surface of the stretchable substrate and connected to each of the first OLED panels, a plurality of second data link lines, a third constant voltage link line and a fourth constant voltage link line disposed in the non-display area of the lower surface of the stretchable substrate and connected to each of the second OLED panels, and a plurality of stretchable lines disposed inside the stretchable substrate and connected to the first and second OLED panels in a predetermined shape.

The plurality of first OLED panels and the plurality of second OLED panels can be alternately disposed.

The predetermined shape of the plurality of stretchable lines can include a spring shape.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the Invention. In the drawings:

FIG. 3 is a cross-sectional view schematically showing the stretchable display device according to the first embodiment of the present invention taken along line I-I' of FIG. 2.

DETAILED DESCRIPTION OF THE EMBODIMENTS

Figure 1:
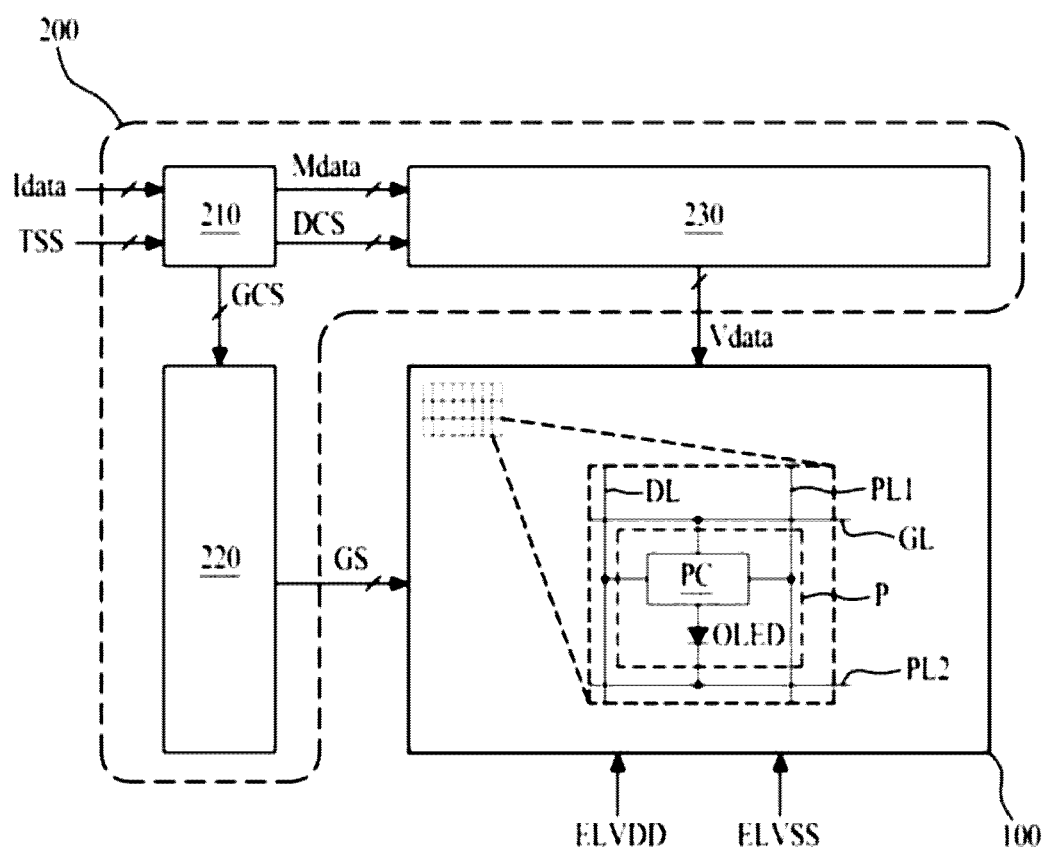
FIG. 1 is a diagram showing the configuration of an OLED display device in order to explain a stretchable display device according to embodiments of the present invention.

The advantages and features of the present invention and the way of attaining the same will become apparent with reference to embodiments described below in detail in conjunction with the accompanying drawings. The present invention, however, is not limited to the embodiments disclosed hereinafter and may be embodied in many different forms. Rather, the exemplary embodiments are provided so that this disclosure will be thorough and complete and will fully convey the scope to those skilled in the art. Thus, the scope of the present invention should be defined by the claims.

The shapes, sizes, ratios, angles, numbers, and the like, which are illustrated in the drawings in order to describe various embodiments of the present invention, are merely given by way of example, and therefore, the present invention is not limited to the illustrations in the drawings. The same or extremely similar elements are designated by the same reference numerals throughout the specification. In addition, in the description of the present invention, a detailed description of related known technologies will be omitted when it may make the subject matter of the present invention rather unclear.

In the present specification, when the terms "comprises", "includes", and the like are used, other elements may be added unless the term "only" is used. An element described in the singular form is intended to include a plurality of elements unless context clearly indicates otherwise.

In the interpretation of constituent elements included in the various embodiments of the present invention, the constituent elements are interpreted as including an error range even if there is no explicit description thereof.

When describing positional relationships, for example, when the positional relationship between two parts is described using "on", "above", "below", "aside", or the like, one or more other parts may be located between the two parts unless the term "directly" or "closely" is used.

Although terms such as, for example, "first" and "second" may be used to describe various elements, these terms are merely used to distinguish the same or similar elements from each other. The functions or structures of the elements are not limited by the ordinal numbers or the prefixes of the elements.

The respective features of the various embodiments of the present invention may be partially or wholly coupled to and combined with each other, and various technical linkage and driving thereof are possible. These various embodiments may be performed independently of each other, or may be performed in association with each other.

The stretchable display device according to the embodiments of the present invention having the above features will be described in greater detail with reference to the accompanying drawings. All the components of the stretchable display device including OLED display devices according to all embodiments of the present invention are operatively coupled and configured.

FIG. 1 is a diagram showing the configuration of an organic light emitting diode (OLED) display device in order to explain a stretchable display device according to embodiments of the present invention.

Referring to FIG. 1, the OLED display device according to an embodiment of the present invention includes a display panel 100 and a panel driver 200. The display panel 100 includes a plurality of pixels P.

As an OLED of each pixel P emits light according to a data voltage Vdata received from the panel driver 200, the display panel 100 displays a predetermined color image through light emitted from each pixel P. To this end, the display panel 100 includes n (n being a natural number) data lines DL and m (m being a natural number) gate lines GL formed to cross each other to define a pixel area, a first constant voltage line PL1 formed in parallel to the n data lines DL and connected to each pixel P, and a second constant voltage line PL2.

The n data lines DL and the m gate lines GL are formed to cross each other at a constant interval. Here, the m gate lines GL form m horizontal lines of the display panel 100.

The first constant voltage line PL1 is disposed adjacent to the data lines DL to supply a first constant voltage ELVDD from a power supply to each pixel, and the second constant voltage line PL2 supplies a second constant voltage ELVSS having a lower voltage level than the first constant voltage ELVDD or a ground voltage level from the power supply to each pixel.

Each pixel P emits light having a predetermined single color by data current corresponding to the data voltage Vdata received from a corresponding data line DL in response to a gate signal GS (scan signal) received from a corresponding gate line (GL). Each of the plurality of pixels P emits any one of red, green, blue and white light. Here, other combinations of colors can be used for the plurality of pixels. Therefore, a unit pixel for displaying one color image includes adjacent red, green and blue pixels or adjacent red, green, blue and white pixels. To this end, each of the plurality of pixels includes an OLED and a pixel circuit PC for independently driving the OLED.

The OLED is connected between the pixel circuit PC and the second constant voltage line PL2 to emit light in proportion to the data current received from the pixel circuit PC, thereby emitting light having a predetermined single color. To this end, the OLED includes an anode (or a pixel electrode) connected to the pixel circuit PC, a cathode (or a reflection electrode) connected to the second constant voltage line PL2 and an organic layer formed between the anode and the cathode.

Here, the organic layer can be formed to have a structure of a hole transport layer/an organic light emitting layer/an electron transport layer or a structure of a hole injection layer/a hole transport layer/an organic light emitting layer/an electron transport layer/an electron injection layer. Further, a functional layer for improving luminous efficacy or lifespan of the organic light emitting layer can be further formed in the organic layer.

The pixel circuit PC controls current flowing from the first constant voltage line PL1 to the OLED based on the data voltage Vdata supplied from the panel driver 200 to the data lines DL in response to a gate signal GS supplied from the panel driver 200 to the gate lines GL.

To this end, the pixel circuit PC includes a driving transistor for controlling current flowing from the first constant voltage line PL1 to the OLED based on the data voltage Vdata, a switching transistor for supplying the data voltage Vdata to the gate electrode of the driving transistor, and a storage capacitor connected between the gate electrode and the source electrode of the driving transistor to maintain a gate-source voltage of the driving transistor during one frame.

Here, the pixel circuit PC can further include a compensation circuit corresponding to an internal compensation structure for compensating for threshold voltage/mobility change of the driving transistor inside the pixel P or an external compensation structure for sensing and compensating for threshold voltage/mobility change of the driving transistor outside the display panel 100 through data correction, in addition to the two transistors and one capacitor.

The panel driver 200 includes a timing controller 210, a gate driver 220 and a data driver 230.

The timing controller 210 generates a gate control signal GCS for controlling the gate driver 220 and a data control signal DCS for controlling the data driver 230 based on timing synchronization signals TSS such as a vertical synchronization signal, a horizontal synchronization signal, a data enable signal and a main clock received from the outside, for example, a system main body or a graphics card. The timing controller 210 aligns and modulates a received image signal and supplies the aligned and modulated signal to the data driver 230.

The gate driver 220 generates a gate signal GS for data addressing in response to the gate control signal GCS received from the timing controller 210 and sequentially supplies the gate signal to the m gate lines GL. The gate driver 220 can include a shift register for sequentially outputting the gate signal GS according to the gate control signal GCS.

The data driver 230 converts image data received from the timing controller 210 into an analog data voltage Vdata in response to the data control signal DCS received from the timing controller 210 and supplies the analog data voltage to the data line DL of each pixel P.

A stretchable display device composed of an OLED display device according to embodiments of the present invention will now be described. Here, the OLED display device can be the OLED display device of FIG. 1 or other types.

Figure 2:
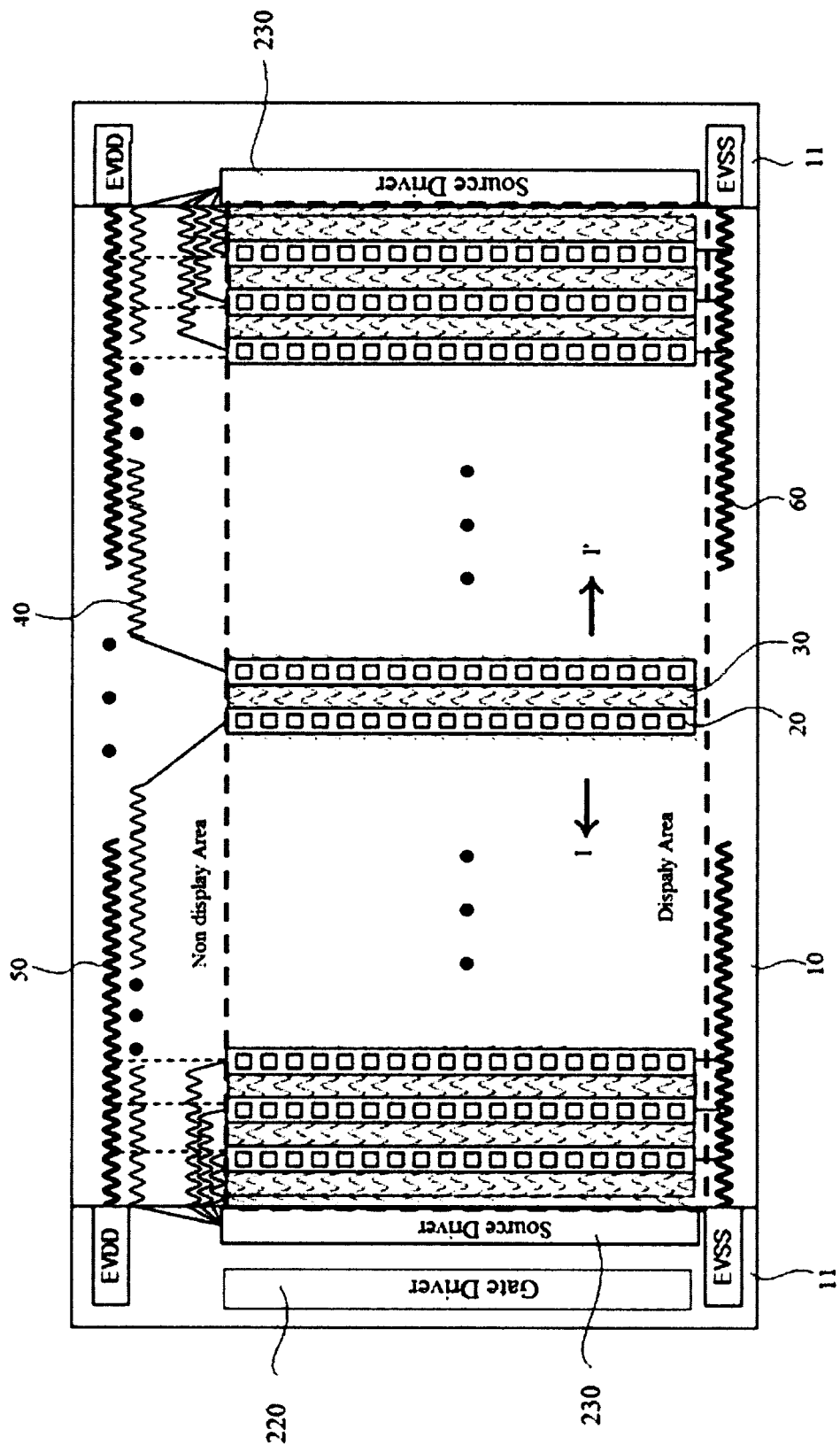
FIG. 2 is a plan view schematically showing a stretchable display device according to a first embodiment of the present invention.

FIG. 2 is a plan view schematically showing a stretchable display device according to a first embodiment of the present invention, and FIG. 3 is a cross-sectional view schematically showing the stretchable display device according to the first embodiment of the present invention taken along line I-I' of FIG. 2.

Referring to FIGS. 1 and 2, the stretchable display device according to the first embodiment of the present invention includes a stretchable substrate 10 capable of being stretched (e.g., lengthened or expanded) or contracted (e.g., shortened or shrunk) and a non-stretchable substrate formed on one or both sides (or any side(s)) of the stretchable substrate 10, as shown in FIG. 2.

The stretchable substrate 10 is formed of a stretchable insulating material such as elastomer. For example, various types of synthetic rubber such as thermosetting polyurethane, thermoplastic polyurethane, silicone, polyvinyl chloride, natural rubber, polydimethylsiloxane (PDMS) and ethylene propylene rubber are applicable.

The stretchable substrate 10 is divided into a display area and a non-display area. A plurality of OLED panels 20 is disposed at a certain interval in the display area of the stretchable substrate 10 and a plurality of data link lines 40, a first constant voltage link line (EVDD link line) 50 and a second constant voltage link line (EVSS link line) 60 are disposed in the non-display area of the stretchable substrate 10.

Although the plurality of data link lines 40, the first constant voltage link line (EVDD link line) 50 and the second constant voltage link line (EVSS link line) 60 can be formed on the same layer, these lines are preferably formed on different layers.

For example, the first constant voltage link line 50 and the second constant voltage link line 60 are formed on a first insulating layer, a second insulating layer is formed on the first insulating layer including the first constant voltage link line 50 and the second constant voltage link line 60, and the plurality of data link lines 40 is formed on the second insulating layer.

In contrast, the plurality of data link lines 40 can be formed on a first insulating layer, a second insulating layer can be formed on the first insulating layer including the plurality of data link lines 40, and the first constant voltage link line 50 and the second constant voltage link line 60 can be formed on the second insulating layer.

The plurality of data link lines 40 disposed on the stretchable substrate 10 in the non-display area is connected to the respective data lines of the plurality of OLED panels 20, the first constant voltage link line (EVDD link line) 50 is connected to the respective first constant voltage lines of the plurality of OLED panels 20, and the second constant voltage link line (EVSS link line) 60 is connected to the respective second constant voltage lines of the plurality of OLED panels 20.

FIG. 2 shows the stretchable display device capable of being stretched or contracted in an X-axis direction, but other variations are possible. The plurality of data link lines 40, the first constant voltage link line (EVDD link line) 50 and the second constant voltage link line (EVSS link line) 60 disposed in the X-axis direction can be formed in a stretchable or contractible wavy pattern.

The plurality of data link lines 40, the first constant voltage link line (EVDD link line) 50 and the second constant voltage link line (EVSS link line) 60 disposed in a Y-axis direction can be formed in a stretchable or contractible wavy pattern or in a general non-stretchable pattern.

Each OLED panel 20 has a bar shape extending in the Y-axis direction and includes a unit pixel including at least three subpixels 21 in a horizontal direction. At least three subpixels 21 include red, green and blue subpixels or red, green, blue and white subpixels. Accordingly, each OLED panel having the bar shape includes a plurality of unit pixels in the Y-axis direction.

The gate driver 220 and the data driver 230 are disposed on the non-stretchable substrate 11.

Although the data drivers 230 are disposed on both of the non-stretchable substrates 11 and the gate driver 220 is disposed one the non-stretchable substrate 11 in FIG. 2, the present invention is not limited thereto and other variations are possible.

For example, both the data driver 230 and the gate driver 220 can be disposed on one non-stretchable substrate 11, and both the data driver 230 and the gate driver 220 can be disposed on the other non-stretchable substrate 11.

Alternatively, the gate driver 220 can be disposed on one non-stretchable substrate 11 and the data driver 230 can be disposed on the other non-stretchable substrate 11.

Alternatively, the gate driver 220 can be disposed on one non-stretchable substrate 11 and both the gate driver 220 and the data driver 230 can be disposed on the other non-stretchable substrate 11.

In addition, a plurality of stretchable lines 30 having a spring shape is disposed inside the stretchable substrate 10. The stretchable lines 30 having the spring shape and disposed inside the stretchable substrate 10 can be a plurality of gate lines (scan lines).

As shown in FIG. 3, since the plurality of OLED panels 20 is disposed (e.g., fixed) on the stretchable substrate 10 at a constant interval, a portion A of the stretchable substrate 10, in which the plurality of OLED panels 20 is disposed (e.g., fixed), is not stretched or contracted, and a portion B of the stretchable substrate 10 between the plurality of OLED panels 20 is stretched or contracted.

Meanwhile, the stretchable lines 30 are electrically connected to the gate lines of the OLED panels 20.

Figure 4A:
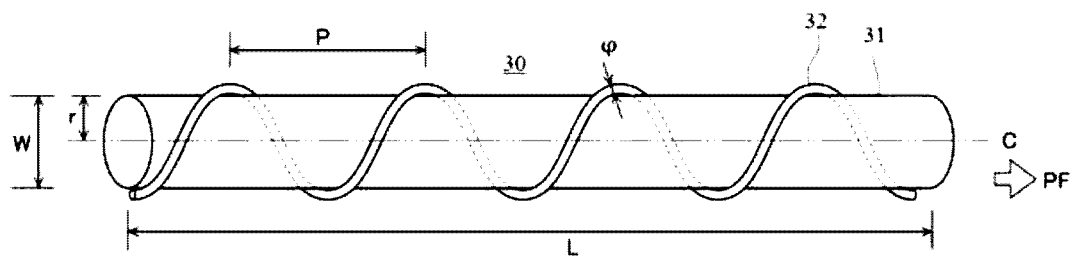
FIG. 4a is a side view in a state in which a stretchable line having a spring shape according to an example of the present invention is not stretched.
Figure 4B:
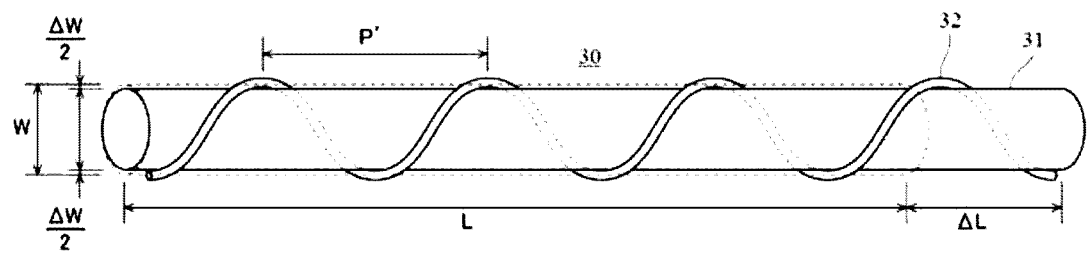
FIG. 4b is a side view in a state in which a stretchable line having a spring shape according to an example of the present invention is stretched.

FIG. 4a is a side view in a state in which a stretchable line having a spring shape according to an example of the present invention is not stretched, and FIG. 4b is a side view in a state in which a stretchable line having a spring shape according to an example of the present invention is stretched.

Referring to FIGS. 4a and 4b, the stretchable line 30 having the spring shape according to the examples of the present invention includes a support 31 and a conductor line 32.

The support 31 can be formed of a stretchable insulating material such as elastomer, for example. The support 31 is preferably formed of the same material as the stretchable substrate 10. The support 31 is a core material having a circular cross section.

The conductor line 32 is spirally wound around the support 31. In FIGS. 4a and 4b, an axis C is the center axis of the support 31, and the conductor line 32 is wound on the outer surface of the support 31 and is supported by the support 31 located inside at least a spirally wound portion. The conductor line 32 is wound around the support 31 at a certain distance. More specifically, the conductor line 12 is wound around the support 31 such that the length of the axis C when the conductor line makes one rotation around the support 31, for example, a pitch length P, is constant.

The conductor line 32 is formed of one of copper, gold, silver, aluminum, titanium, molybdenum, tungsten, nickel, iron and an alloy thereof, and a material having high conductivity can be used.

The cross-sectional shape of the conductor line 32 can be any shape, but can be a circular shape, an elliptical shape, a rounded rectangular shape, a rectangular shape, etc.

The length of the stretchable line 30 according to the embodiment of the present invention is equal to that of the support 31. As described above, the stretchable line 30 is embedded in the stretchable substrate 10.

The stretchable line 30 shown in FIG. 4a is stretched as shown in FIG. 4b when tensile force PF is applied in the direction of the axis C. In addition, when tensile force PF is released, the stretchable line 30 is contracted as shown in FIG. 4a. When tensile force is applied, stress is generated inside the support 31 and the support 31 is stretched and, at the same time, the cross section thereof is contracted in proportion to the stress. In FIG. 4b, the length L of the support 31 increases by $\Delta L$ to become L+$\Delta L$ and the diameter W of the cross section decreases by $\Delta W$ to become W-$\Delta W$.

Figure 5:
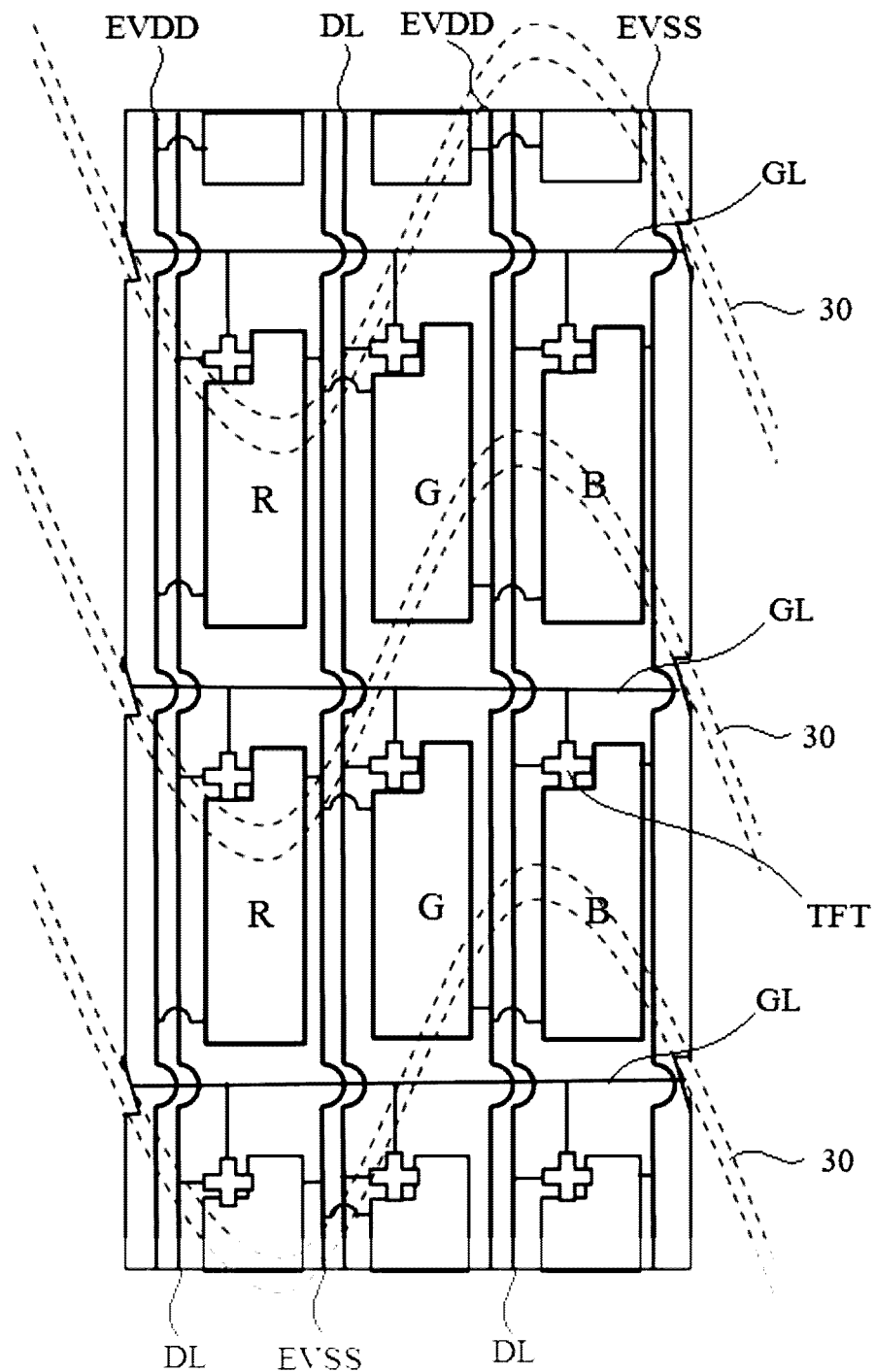
FIG. 5 is a diagram showing the configuration of an OLED panel of the stretchable display device according to the first embodiment of the present invention.

FIG. 5 is a diagram showing the configuration of an OLED panel 20 of the stretchable display device according to the first embodiment of the present invention. Although the unit pixel includes three subpixels 21 of red (R), green (G) and blue (B) in FIG. 5, the present invention is not limited thereto and the unit pixel can include four subpixels of red (R), green (G), blue (B) and white (W) or other variations.

As shown in FIG. 5, each OLED panel 20 includes a plurality of data lines DL and a plurality of gate lines GL formed to cross each other to define a pixel area, and a first constant voltage line EVDD and a second constant voltage line EVSS disposed in parallel to the data lines DL to be connected to each subpixel.

The plurality of data lines DL and the plurality of gate lines GL are formed to cross each other at a constant interval. Here, the m gate lines GL form m horizontal lines of the display panel 100.

Each subpixel emits light having a predetermined single color by data current corresponding to the data voltage received from a corresponding data line DL in response to the gate signal (scan signal) received from a corresponding gate line GL. FIG. 5 shows only a switching thin film transistor TFT and an OLED element OLED in each subpixel. However, as described with reference to FIG. 1, the pixel circuit including the driving transistor, the switching transistor and the storage capacitor can be disposed and a compensation circuit corresponding to an internal compensation structure for compensating for threshold voltage/mobility change of the driving transistor inside the pixel or an external compensation structure for sensing and compensating for threshold voltage/mobility change of the driving transistor outside the OLED panel through data correction can be further included.

Each data line DL of each OLED panel 20 is connected to a corresponding data link line 40, each first constant voltage line EVDD is connected to the first constant voltage link line 50, each second constant voltage line EVSS is connected to the second constant voltage link line 60, and each gate line GL is connected to a corresponding stretchable line 30, as described with reference to FIG. 2.

In FIG. 5, each gate line GL of each OLED panel 20 is connected to the stretchable line 30 at both sides of the OLED panel 20. However, the present invention is not limited thereto and other variations are possible. For example, each gate line GL can be connected to the stretchable line 30 at one side of the OLED panel 20 or each gate line GL can be connected to the stretchable line 30 at the center of the OLED panel.

Although the plurality of OLED panels 20 is disposed only on the upper surface of the stretchable substrate 10 in FIG. 3, the present invention is not limited thereto and the plurality of OLED panels 20 can be disposed on both surfaces (upper and lower surfaces) of the stretchable substrate 10.

Figure 6:
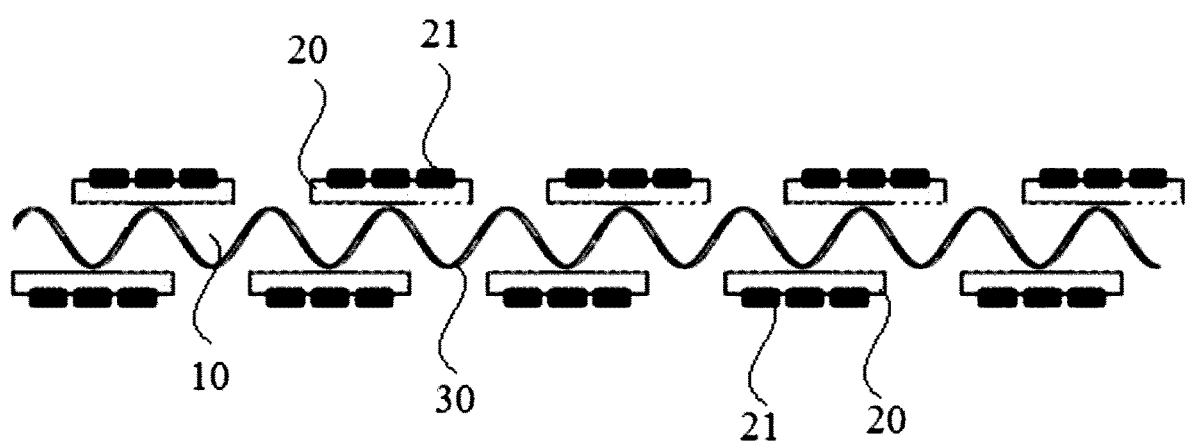
FIG. 6 is a cross-sectional view schematically showing a stretchable display device according to a second embodiment of the present invention taken along line I-I' of FIG. 2.
Figure 7:
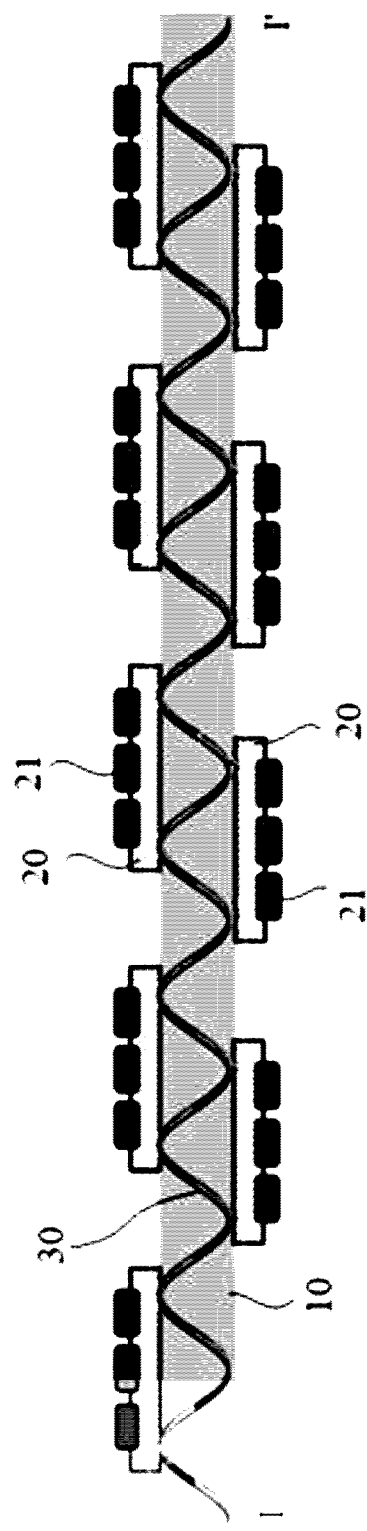
FIG. 7 is a cross-sectional view schematically showing a stretchable display device according to a third embodiment of the present invention taken along line I-I' of FIG. 2.

FIG. 6 is a cross-sectional view schematically showing a stretchable display device according to a second embodiment of the present invention taken along line I-I' of FIG. 2, and FIG. 7 is a cross-sectional view schematically showing a stretchable display device according to a third embodiment of the present invention taken along line I-I' of FIG. 2.

In the stretchable display devices according to the second and third embodiments of the present invention, as shown in FIGS. 6 and 7, a plurality of OLED panels 20 is disposed on both surfaces of the stretchable substrate 10 capable of being stretched or contracted at a constant interval.

For example, both surfaces (upper and lower surfaces) of the stretchable substrate 10 are divided into a display area and a non-display area, a plurality of OLED panels 20 is disposed in the display area of both surfaces of the stretchable substrate 10 at a constant interval, and a plurality of data link lines 40, a first constant voltage link line (EVDD link line) 50 and a second constant voltage link line (EVSS link line) 60 are disposed in the non-display area of both surfaces of the stretchable substrate 10.

Although the plurality of data link lines 40, the first constant voltage link line (EVDD link line) 50 and the second constant voltage link line (EVSS link line) 60 disposed on both surfaces of the stretchable substrate 10 can be formed on the same layers, these lines are preferably formed on different layers.

For example, the first constant voltage link line 50 and the second constant voltage link line 60 are formed on a first insulating layer, a second insulating layer is formed on the first insulating layer including the first constant voltage link line 50 and the second constant voltage link line 60, and the plurality of data link lines 40 is formed on the second insulating layer.

In contrast, the plurality of data link lines 40 can be formed on a first insulating layer, a second insulating layer can be formed on the first insulating layer including the plurality of data link lines 40, and the first constant voltage link line 50 and the second constant voltage link line 60 can be formed on the second insulating layer.

The plurality of data link lines 40 disposed on the upper surface of the stretchable substrate 10 in the non-display area is connected to the respective data lines of the plurality of OLED panels 20 disposed on the upper surface of the stretchable substrate 10 in the non-display area, the first constant voltage link line (EVDD link line) 50 disposed on the upper surface of the stretchable substrate 10 in the non-display area is connected to the respective first constant voltage lines of the plurality of OLED panels 20 disposed on the upper surface of the stretchable substrate 10 in the non-display area, and the second constant voltage link line (EVSS link line) 60 disposed on the upper surface of the stretchable substrate 10 in the non-display area is connected to the respective second constant voltage lines of the plurality of OLED panels 20 disposed on the upper surface of the stretchable substrate 10 in the non-display area.

In addition, the plurality of data link lines 40 disposed on the lower surface of the stretchable substrate 10 in the non-display area is connected to the respective data lines of the plurality of OLED panels 20 disposed on the lower surface of the stretchable substrate 10 in the non-display area, the first constant voltage link line (EVDD link line) 50 disposed on the lower surface of the stretchable substrate 10 in the non-display area is connected to the respective first constant voltage lines of the plurality of OLED panels 20 disposed on the lower surface of the stretchable substrate 10 in the non-display area, and the second constant voltage link line (EVSS link line) 60 disposed on the lower surface of the stretchable substrate 10 in the non-display area is connected to the respective second constant voltage lines of the plurality of OLED panels 20 disposed on the lower surface of the stretchable substrate 10 in the non-display area.

The plurality of data link lines 40, the first constant voltage link line (EVDD link line) 50 and the second constant voltage link line (EVSS link line) 60 disposed on the upper and lower surfaces of the stretchable substrate 10 in the non-display area and disposed in the X-axis direction can be formed in a stretchable or contractible wavy pattern.

Similarly, the plurality of data link lines 40, the first constant voltage link line (EVDD link line) 50 and the second constant voltage link line (EVSS link line) 60 disposed in a Y-axis direction can be formed in a stretchable or contractible wavy pattern or in a general non-stretchable pattern.

Each of the OLED panels 20 disposed on the upper and lower surfaces of the stretchable substrate 10 in the non-display area has a bar shape extending in the Y-axis direction and includes a unit pixel including at least three subpixels 21 in a horizontal direction. At least three subpixels 21 include red, green and blue subpixels or red, green, blue and white subpixels (or other combinations). Accordingly, each OLED panel having the bar shape includes a plurality of unit pixels in the Y-axis direction.

A gate driver 220 and a data driver 230 for driving the OLED panels 20 disposed on the upper and lower surfaces of the stretchable substrate 10 are disposed on both surfaces (upper and lower surfaces) of the non-stretchable substrate 11.

In addition, a plurality of stretchable lines 30 having a spring shape is disposed inside the stretchable substrate 10. The stretchable lines 30 having the spring shape and disposed inside the stretchable substrate 20 correspond to corresponding gate lines (scan lines) of the OLED panels 20 disposed in the display area of both surfaces of the stretchable area 10.

The configuration of the stretchable lines 30 has been described with reference to FIGS. 4a and 4b.

In addition, the detailed configuration of the OLED panels 20 disposed in the display area of both surfaces of the stretchable substrate 10 has been described with reference to FIG. 5.

In the stretchable display devices according to the second and third embodiments of the present invention, as shown in FIGS. 6 and 7, the plurality of OLED panels 20 disposed on the upper surface of the stretchable substrate 10 and the plurality of OLED panels 20 disposed on the lower surface of the stretchable substrate 10 are alternately disposed, in order to easily connect the stretchable lines 30 having the spring shape with the plurality of OLED panels 20 disposed on both surfaces of the stretchable substrate 10.

For example, the plurality of OLED panels 20 disposed on the upper surface of the stretchable substrate 10 and the plurality of OLED panels 20 disposed on the lower surface of the stretchable substrate 10 are alternately disposed, and the side surfaces of the plurality of OLED panels 20 disposed on the upper surface of the stretchable substrate do not partially overlap the side surfaces of the plurality of OLED panels 20 disposed on the lower surface of the stretchable substrate in consideration of the stretching or contracting function of the stretchable substrate 10.

In the stretchable display device according to the second embodiment of the present invention, as shown in FIG. 6, the stretchable line 30 is connected to the gate line GL of each of the OLED panels 20 disposed on both surfaces of the stretchable substrate 20 once.

For example, the stretchable line 30 is connected to the gate line GL at one side of the OLED panel 20.

In the stretchable display device according to the third embodiment of the present invention, as shown in FIG. 7, the stretchable line 30 is connected to the gate line GL of each of the OLED panels 20 disposed on both surfaces of the stretchable substrate 20 twice.

For example, the stretchable line 30 is connected to the gate line GL at both sides of the OLED panel 20.

As described above, since the plurality of stretchable lines is formed in the spring shape, it is possible to maximize elongation (compression rate or elongation rate).

In addition, since the plurality of stretchable lines is disposed inside the stretchable substrate, it is possible to prevent (or minimize) the stretchable lines from being peeled off from the stretchable substrate.

Since the plurality of stretchable lines is disposed inside the stretchable substrate and the gate signal is supplied to all OLED panels disposed on both surfaces of the stretchable substrate, it is possible to halve (or reduce) the number of stretchable lines.

Since the stretchable lines are formed in the spring shape, it is possible to suppress each layer from being peeled off upon elongation according to anchoring of the spring structure and to manufacture a structurally stable display device.

The stretchable display device according to the embodiment(s) of the present invention having the above features has the following effects and advantages.

First, since the plurality of stretchable lines is formed in the spring shape, it is possible to maximize elongation (compression rate or elongation rate).

Second, since the plurality of stretchable lines is disposed inside the stretchable substrate, it is possible to prevent or reduce the stretchable lines from peeling off of the stretchable substrate.

Third, since the plurality of stretchable lines is disposed inside the stretchable substrate and the gate signal is supplied to all OLED panels disposed on both surfaces of the stretchable substrate, it is possible to halve or reduce the number of stretchable lines.

Fourth, since the stretchable lines are formed in the spring shape, it is possible to suppress each layer from being peeled off upon elongation according to anchoring of the spring structure and to manufacture a structurally stable display device.

The present invention is not limited to the above-described embodiments and the accompanying drawings. Those skilled in the art will appreciate that various substitutions, modifications and variations are possible without departing from the technical scope and spirit of the invention.

What is claimed is:

1. A stretchable display device comprising:
    a stretchable substrate capable of being stretched or contracted, the stretchable substrate being divided into a display area and a non-display area;
    a plurality of organic light emitting diode (OLED) panels disposed in the display area of the stretchable substrate at a constant interval;
    a plurality of data link lines, a first constant voltage link line and a second constant voltage link line disposed in the non-display area of the stretchable substrate and connected to each of the plurality of OLED panels;
    a plurality of stretchable lines disposed inside the stretchable substrate in a predetermined shape;
    at least one non-stretchable substrate at one or more sides of the stretchable substrate; and
    at least one of gate and data drivers on the at least one non-stretchable substrate.

2. The stretchable display device according to claim 1, wherein the stretchable substrate is formed of one of thermosetting polyurethane, thermoplastic polyurethane, silicone, polyvinyl chloride, natural rubber, polydimethylsiloxane (PDMS) and ethylene propylene rubber.

3. The stretchable display device according to claim 1, wherein the plurality of data link lines and the first and second constant voltage link lines are formed on different layers.

4. The stretchable display device according to claim 1, wherein the plurality of data link lines and the first and second constant voltage link lines are formed in a stretchable or contractible pattern.

5. The stretchable display device according to claim 1, wherein each of the plurality of OLED panels has a bar shape extending in a Y-axis direction, includes a unit pixel including at least three subpixels in a horizontal direction, and includes a plurality of unit pixels in the Y-axis direction.

6. The stretchable display device according to claim 1, wherein a gate signal is applied to each of the plurality of stretchable lines, and each of the plurality of stretchable lines is connected to a gate line of each of the plurality of OLED panels.

7. The stretchable display device according to claim 1, wherein each of the plurality of stretchable lines includes a support and a conductor line wound around the support at a constant interval.

8. The stretchable display device according to claim 7, wherein the support is formed of the same material as the stretchable substrate, and has a circular cross-sectional shape.

9. The stretchable display device according to claim 7, wherein the conductor line is formed of one of copper, gold, silver, aluminum, titanium, molybdenum, tungsten, nickel, iron and an alloy thereof.

10. The stretchable display device according to claim 1, wherein the predetermined shape of the plurality of stretchable lines disposed inside the stretchable substrate includes a spring shape.

* * * * *